US011201259B2

(12) United States Patent
Pan

(10) Patent No.: US 11,201,259 B2
(45) Date of Patent: Dec. 14, 2021

(54) ENHANCEMENT FILM AND LENS ARRAY OF QUANTUM DOT DISPLAY PANEL

(71) Applicant: SHENZHEN CHINA STAR OPTOELECTRONICS SEMICONDUCTOR DISPLAY TECHNOLOGY CO., LTD., Shenzhen (CN)

(72) Inventor: Su Pan, Shenzhen (CN)

( * ) Notice: Subject to any disclaimer, the term of this patent is extended or adjusted under 35 U.S.C. 154(b) by 156 days.

(21) Appl. No.: 16/623,786

(22) PCT Filed: Nov. 15, 2019

(86) PCT No.: PCT/CN2019/118967
§ 371 (c)(1),
(2) Date: Dec. 18, 2019

(87) PCT Pub. No.: WO2021/088113
PCT Pub. Date: May 14, 2021

(65) Prior Publication Data

US 2021/0343895 A1 Nov. 4, 2021

(30) Foreign Application Priority Data

Nov. 5, 2019 (CN) ......................... 201911069422.3

(51) Int. Cl.
*H01L 33/04* (2010.01)
*H01L 33/58* (2010.01)
*H01L 33/00* (2010.01)
*H01L 27/15* (2006.01)

(52) U.S. Cl.
CPC ............ *H01L 33/04* (2013.01); *H01L 27/156* (2013.01); *H01L 33/005* (2013.01); *H01L 33/58* (2013.01); *H01L 2933/0058* (2013.01)

(58) Field of Classification Search
CPC ....... H01L 33/04; H01L 33/58; H01L 33/005; H01L 27/156; H01L 2933/0058
See application file for complete search history.

(56) References Cited

U.S. PATENT DOCUMENTS

2021/0174053 A1* 6/2021 Nam .................. G06K 9/00046

* cited by examiner

*Primary Examiner* — Sitaramarao S Yechuri

(57) ABSTRACT

The present invention provides a quantum dot display panel and a manufacturing method thereof. The quantum dot display panel includes a pixel layer having retaining walls and quantum dots, a lens layer having a lens array, and an enhancement film having a prism array. When ambient light enters the quantum dot display panel, it will be will be converged and collimated through the enhancement film, and focused onto the retaining walls with light absorption characteristics. The lens array maintains contrast of the quantum dot display panel, and the enhancement film enhances a display effect of wide viewing angle of the quantum dot display panel.

20 Claims, 3 Drawing Sheets

ENHANCEMENT FILM AND LENS ARRAY OF QUANTUM DOT DISPLAY PANEL

FIELD OF INVENTION

The present invention is related to the field of quantum dot display panel technology, and specifically to an enhancement film and a lens array of quantum dot display panel.

BACKGROUND OF INVENTION

Quantum dots (QDs) are tiny semiconductor particles on the nanometer scale. Their optical and electronic properties are different from larger ordinary particles due to quantum mechanics. When a quantum dot receives external light, electrons in the quantum dot are excited, and the electrons transit from a valence band to a conduction band. When the excited electrons return to the valence band again, it will accompany light emission to release its energy, and this is a so-called photo-emissive quantum dot. In addition, the quantum dots also emit light due to the energy provided by an electric field, and this is a so-called electro-emissive quantum dot.

A size of the quantum dot will affect its luminous characteristics. A larger quantum dot, which has a diameter of about 5-6 nanometers, emits light having a longer wavelength such as orange or red light when it is excited. A smaller quantum dot, which has a diameter of about 2-3 nanometers, emits light having shorter wavelength such as blue or green light when it is excited. Therefore, different-sized quantum dots can be used to obtain different colors of light. Light emitted by quantum dots has high color purity, and a narrow and symmetrical distributed emission spectrum. Furthermore, the quantum dots have high luminous efficiency, and their quantum efficiency is as high as 90%. The display panel made of the quantum dots has good color expressiveness and high saturation, and the color gamut covered is greater than 100% of National Television Standards Committee (NTSC).

However, because current technology of electro-emissive quantum dots cannot be applied to mass produced display panels, current quantum dot display panels on the market are all made of photo-emissive quantum dots. Currently there are two main types of photo-emissive quantum dot display panels on the market. One type is an improved liquid crystal displays (LCD), which replaces a traditional white backlight with a blue light-emitting diode (blue-LED) and a quantum dot film, and it directly outputs three colors of red, green, and blue, which are relatively pure colors. As a result, it obtains a better backlight utilization and improves a color space of display panels. This type is called quantum dot enhancement film (QDEF) technology, and its products on the market are called QD-enhanced TV. The other type is an improved organic light-emitting diode (OLED) display panels, which replaces traditional red and green OLEDs with red and green quantum dots, and it is uniformly illuminated by blue OLED, and the red and the green quantum dots are used to convert light of blue OLED. As a result, it solves problems of uneven lifespan of three colors and screen burn-in in the traditional OLED display panels, retains advantages of the OLED display panels, and provides the OLED display panels to output relatively pure light. This is called quantum dot color filter (QDCF) technology, and its products on the market are called QD-OLED TV.

Although QD-OLED TV has many advantages, it is inevitable that ambient light will cause quantum dots in its display panel to emit light. When ambient light enters the display panel of the QD-OLED TV, even if the display panel is in a dark state, the ambient light will excite the quantum dots in the display panel to emit light, reducing display contrast of the display panel and affecting viewing experience of users.

A structure of the display panel of the QD-OLED TV is shown in FIG. 1, which is a structural diagram of a quantum dot display panel in the prior art. The quantum dot display panel includes a pixel layer 100 and a blue backlight source 500. The pixel layer 100 includes a plurality of sub-pixels 120, and two out of every three of the plurality of sub-pixels 120 are filled with red quantum dots 121 and green quantum dots 122. The blue backlight source 500 is disposed under the pixel layer 100.

Light of the blue backlight source 500 passes through each of the plurality of sub-pixels 120 from below the pixel layer 100 to above the pixel layer 100. The light of the blue backlight source 500 excites the red quantum dots 121 and the green quantum dots 122, so that the red quantum dots 121 emit red light, and the green quantum dots 122 emit green light. Therefore, every three of the plurality of sub-pixels 120 can display red, green, and blue light.

Because the red quantum dots 121 and the green quantum dots 122 are photo-emissive quantum dots, they excited by any light sources to emit light. When the quantum dot display panel is in operation, the blue backlight source 500 provides display light to the quantum dot display panel. However, ambient light 700 entering the quantum dot display panel additionally excites the red quantum dots 121 and the green quantum dots 122 to emit light, which generates excitation light 710 of quantum dots beyond the operation of the quantum dot display panel.

SUMMARY OF INVENTION

Even if a quantum dot display panel is in a dark state, ambient light will excite photo-emissive quantum dots in the quantum dot display panel to emit light, and generate excitation light of quantum dots beyond the operation of the quantum dot display panel, reducing display contrast of the quantum dot display panel and affecting viewing experience of users.

In order to solve the problem above, the present invention provides a quantum dot display panel, including a pixel layer, a lens layer, and an enhancement film. The pixel layer includes a plurality of retaining walls and a plurality of sub-pixels defined between the plurality of retaining walls. The lens layer is disposed on the pixel layer and includes a lens array consisting of a plurality of convex lenses. The enhancement film is disposed on the lens layer and includes a prism array consisting of a plurality of prisms facing the pixel layer. A focus of each of the plurality of convex lenses is located in each of the plurality of retaining walls corresponding to each of the plurality of convex lenses.

In the present invention, the quantum dot display panel further includes a blue backlight source disposed under the pixel layer, and the blue backlight source is a light source of a blue organic light-emitting diode or a blue micro light-emitting diode.

In the present invention, light of the blue backlight source passes through each of the plurality of sub-pixels from below the pixel layer to above the pixel layer.

In the present invention, two out of every three of the plurality of sub-pixels are filled with red quantum dots and green quantum dots.

In the present invention, the plurality of retaining walls, the red quantum dots, and the green quantum dots are formed by photolithography or an inkjet printing process.

In the present invention, the lens layer is resin or an organic material, and the lens array is formed by imprinting.

In the present invention, a surface of the lens layer opposite to the pixel layer is a flat surface. The lens layer further includes a lens planarization layer covering a surface of the lens array facing the pixel layer and forming a flat surface.

In the present invention, a surface of the enhancement film opposite to the lens layer is a flat surface. The enhancement film further includes a prism planarization layer covering a surface of the prism array facing the lens layer and forming a flat surface.

In an embodiment of the present invention, the quantum dot display panel further includes a substrate. The pixel layer, the lens layer, the substrate, and the enhancement film are sequentially laminated from bottom to top.

In another embodiment of the present invention, the quantum dot display panel further includes a substrate. The pixel layer, the substrate, the lens layer, and the enhancement film are sequentially laminated from bottom to top.

The present invention further provides a manufacturing method of a quantum dot display panel, including the steps of:

Step S10: forming a pixel layer, wherein the pixel layer includes a plurality of retaining walls and a plurality of sub-pixels defined between the plurality of retaining walls.

Step S20: forming a lens layer on the pixel layer, wherein the lens layer includes a lens array consisting of a plurality of convex lenses.

Step S30: forming an enhancement film on the lens layer, wherein the enhancement film includes a prism array consisting of a plurality of prisms facing the pixel layer.

A focus of each of the plurality of convex lenses is located in each of the plurality of retaining walls corresponding to each of the plurality of convex lenses.

In an embodiment of the present invention, the step S20 further includes the step of:

Step S21: forming the lens layer on a substrate.

The pixel layer, the lens layer, the substrate, and the enhancement film are sequentially laminated from bottom to top.

In another embodiment of the present invention, the step S20 further includes the step of:

Step S21: forming the lens layer on a substrate.

The pixel layer, the substrate, the lens layer, and the enhancement film are sequentially laminated from bottom to top.

In the present invention, the manufacturing method of the quantum dot display panel further includes the step of:

Step S40: forming a blue backlight source under the pixel layer, wherein the blue backlight source is a light source of a blue organic light-emitting diode or a blue micro light-emitting diode.

In the present invention, light of the blue backlight source passes through each of the plurality of sub-pixels from below the pixel layer to above the pixel layer.

In the present invention, the step S10 further includes the step of:

Step S11: filling two out of every three of the plurality of sub-pixels with red quantum dots and green quantum dots.

In the present invention, the step S10 further includes the step of:

Step S12: forming the plurality of retaining walls, the red quantum dots, and the green quantum dots by photolithography or an inkjet printing process.

In the present invention, the step S20 further includes the step of:

Step S22: forming the lens array by imprinting, wherein the lens layer is resin or an organic material.

In the present invention, the step S20 further includes the step of:

Step S23: covering a lens planarization layer on a surface of the lens array facing the pixel layer and forming a flat surface.

A surface of the lens layer opposite to the pixel layer is a flat surface.

In the present invention, the step S30 further includes the step of:

Step S31: covering a prism planarization layer on a surface of the prism array facing the lens layer and forming a flat surface.

A surface of the enhancement film opposite to the lens layer is a flat surface.

Compared to the prior art, a quantum dot display panel of the present invention focuses ambient light onto a plurality of retaining walls in a pixel layer through a lens array, reducing excitation of photo-emissive quantum dots in the quantum dot display panel by the ambient light, and maintaining contrast of the quantum dot display panel. In addition, an enhancement film of the present invention can increase a light emission angle of the quantum dot display panel and enhance a display effect of wide viewing angle of the quantum dot display panel.

DESCRIPTION OF DRAWINGS

In order to further understand detailed technical content and specific implementation of the present invention, please refer to the accompanying drawings of the present invention. However, the drawings are only provided for reference and explanation, and are not intended to limit the present invention.

DETAILED DESCRIPTION OF PREFERRED EMBODIMENTS

The features and spirit of the present invention are described more clearly by the following detailed description of preferred embodiments, rather than limiting the scope of the present invention with the disclosed preferred embodiments. On the contrary, the present invention is to cover various changes and equivalent arrangements within the scope of claims of the present invention.

First Embodiment

FIGS. 2 to 6 are structural diagrams of manufacturing processes of a quantum dot display panel according to a first embodiment of the present invention.

Figure 1:
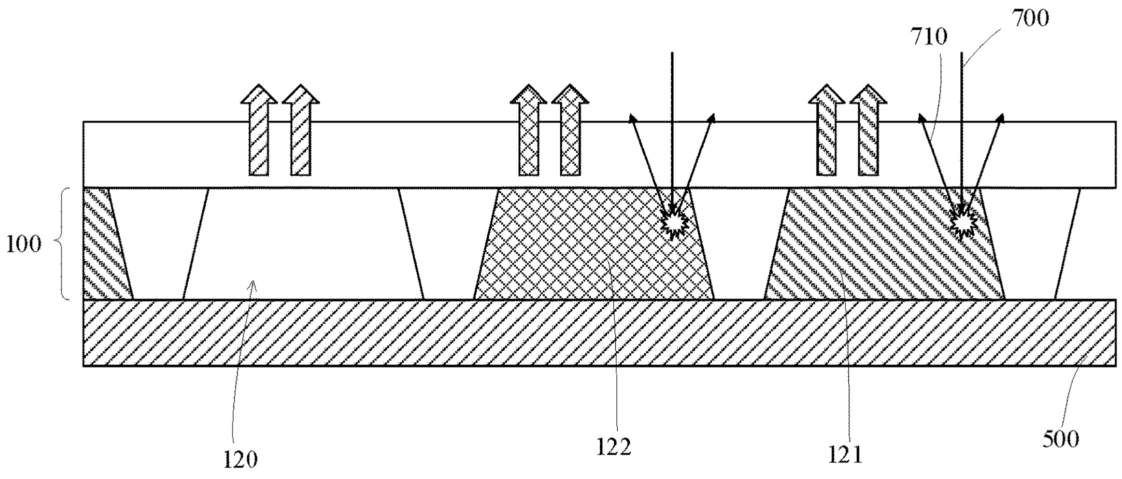
FIG. 1 is a structural diagram of a quantum dot display panel in the prior art.
Figure 2:
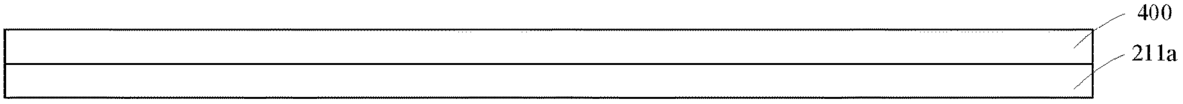
FIGS. 2 to 6 are structural diagrams of manufacturing processes of a quantum dot display panel according to a first embodiment of the present invention.

First, as shown in FIG. 2, resin 211*a* is coated on a substrate 400.

The resin 211*a* can be replaced by another organic material.

Figure 3:
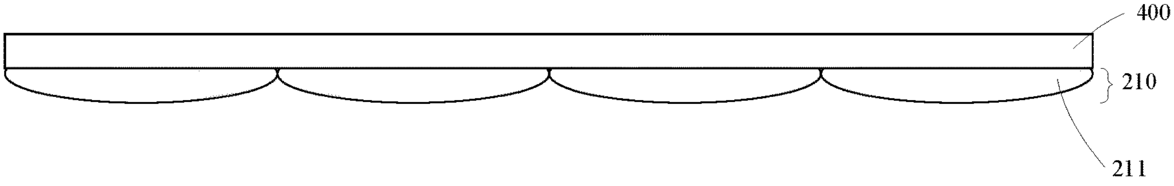

Second, as shown in FIG. 3, the resin 211*a* in the FIG. 2 is formed into a lens array 210 consisting of a plurality of convex lenses 211 by imprinting.

Figure 4:
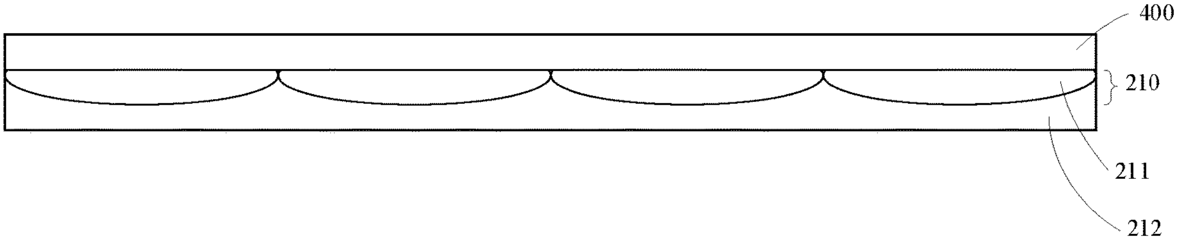

Third, as shown in FIG. 4, a lens planarization layer 212 is formed on the lens array 210. A surface of the lens planarization layer 212 opposite to the lens array 210 is a flat surface, which facilitates subsequent processes.

Figure 5:
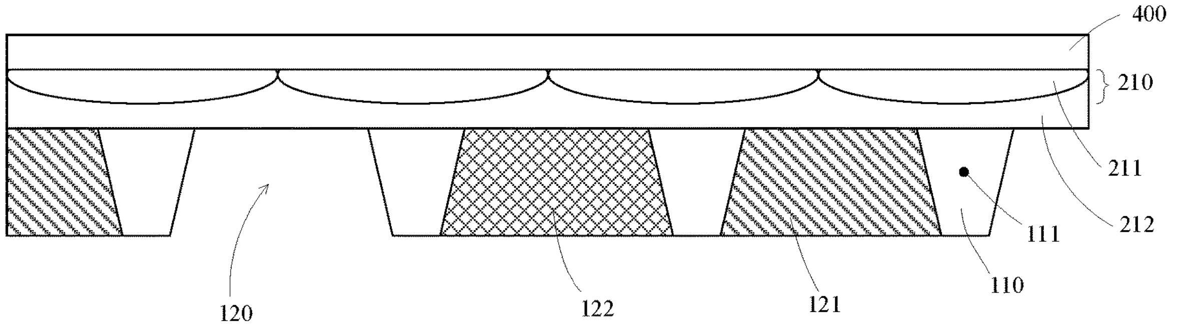

Fourth, as shown in FIG. 5, a pixel layer 100 is disposed on the lens planarization layer 212. In the pixel layer 100, a plurality of retaining walls 110 are formed by photolithography or an inkjet printing process. A position of each of the plurality of retaining walls 110 must be aligned with focus 111 of each of the plurality of convex lenses 211. The focus 111 of each of the plurality of convex lenses 211 is located in anywhere of each of the plurality of retaining walls 110 corresponding to each of the plurality of convex lenses 211. A plurality of sub-pixels 120 are defined between the plurality of retaining walls 110. Two out of every three of the plurality of sub-pixels 120 are filled with red quantum dots 121 and green quantum dots 122 by the photolithography or the inkjet printing process.

Figure 6:
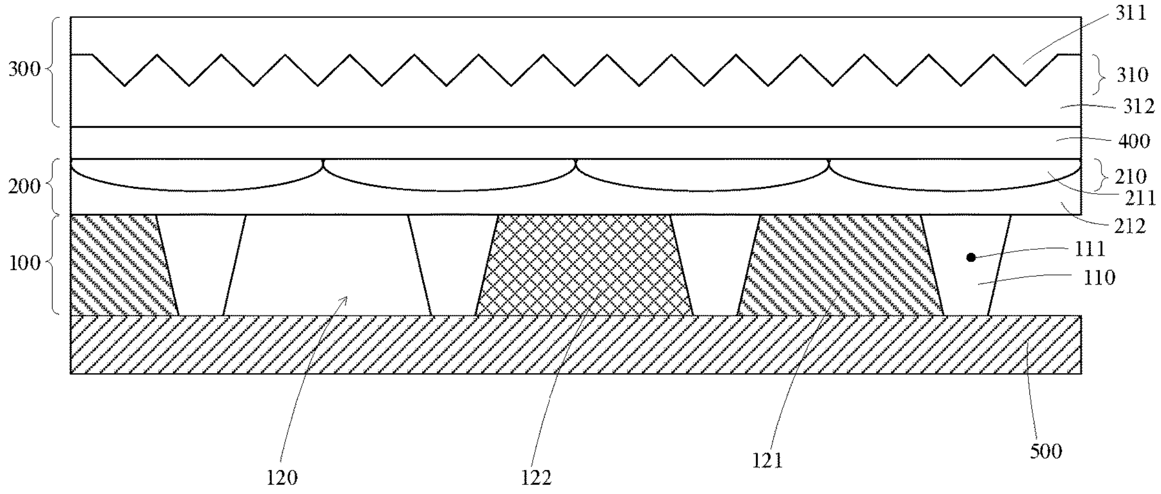

At last, as shown in FIG. 6, a blue backlight source 500 is attached onto a side of the plurality of pixels 120 opposite to the lens array 210. The blue backlight source 500 is a light source of a blue organic light-emitting diode (blue OLED) or a blue micro light-emitting diode (micro LED). Light of the blue backlight source 500 passes through each of the plurality of sub-pixels 120 from below the pixel layer 100 to above the pixel layer 100. The light of the blue backlight source 500 excites the red quantum dots 121 and the green quantum dots 122, so that the red quantum dots 121 emit red light, and the green quantum dots 122 emit green light. Therefore, every three of the plurality of sub-pixels 120 can display red, green, and blue light.

An enhancement film 300 is attached onto a side of the substrate 400 opposite to the lens array 210. The enhancement film 300 includes a prism array 310 consisting of a plurality of prisms 311 facing the lens array 210 and a prism planarization layer 312 disposed on the prism array 310 facing the lens array 210. A surface of the enhancement film 300 opposite to the lens array 210 is a flat surface, and a surface of the prism planarization layer 312 opposite to the prism array 310 is a flat surface.

In the first embodiment of the present invention, a laminated sequence of the quantum dot display panel is: the blue backlight source 500, the pixel layer 100 including the plurality of retaining walls 110 and the plurality of sub-pixels 120, a lens layer 200 including the lens array 210 and the lens planarization layer 212, the substrate 400, and the enhancement film 300 including the prism array 310 and the prism planarization layer 312.

Figure 7:
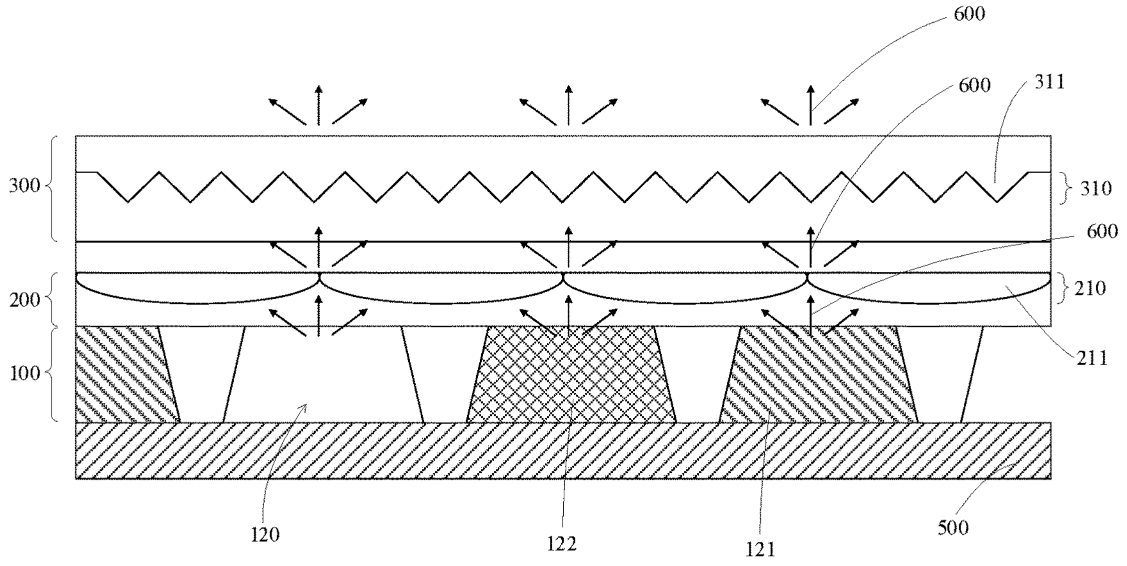
FIG. 7 is a schematic diagram of a path of display light emitted by the quantum dot display panel of the present invention.

FIG. 7 is a schematic diagram of a path of display light 600 emitted by the quantum dot display panel of the present invention.

As shown in FIG. 7, when the light of the blue backlight source 500 passes through each of the plurality of sub-pixels 120, it makes the red quantum dots 121 emit red light, and makes the green quantum dots 122 emit green light. Because the display light 600 emitted from the quantum dot display panel passes through between the plurality of convex lenses 211, the display light 600 will not be deflected by the plurality of convex lenses 211 but will straight into the enhancement film 300. Because of the enhancement film 300 including the prism array 310 consisting of the plurality of prisms 311, when the display light 600 enters the enhancement film 300, the prism array 310 will increase a refraction angle of the display light 600.

Accordingly, compared to the prior art, the enhancement film 300 of the present invention can increase an emission angle of the display light 600 of the quantum dot display panel and enhance a display effect of wide viewing angle of the quantum dot display panel.

Figure 8:
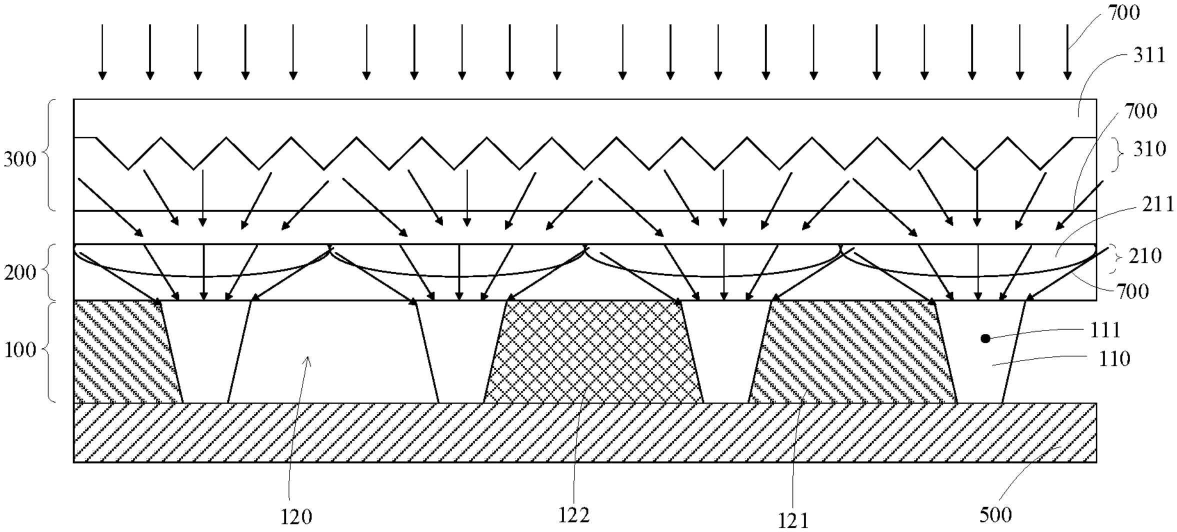
FIG. 8 is a schematic diagram of a path of ambient light entering the quantum dot display panel of the present invention.

FIG. 8 is a schematic diagram of a path of ambient light 700 entering the quantum dot display panel of the present invention.

As shown in FIG. 8, when the ambient light 700 enters the quantum dot display panel of the present invention, it will pass through the enhancement film 300 first. The ambient light 700 will be converged and collimated through the plurality of prisms 311 of the prism array 310 in the enhancement film 300. And because the focus 111 of each of the plurality of convex lenses 211 in the lens array 210 is located in each of the plurality of retaining walls 110 corresponding to each of the plurality of convex lenses 211, the ambient light 700 will be focused onto the plurality of retaining walls 110, rather than enters the red quantum dots 121 and the green quantum dots 122.

When the ambient light 700 passes through the enhancement film 300 and the lens array 210, the ambient light 700 will be focused onto the plurality of retaining walls 110 with light absorption characteristics. And because the ambient light 700 is absorbed by the plurality of retaining walls 110, the ambient light 700 will not additionally excite the red quantum dots 121 and the green quantum dots 122 to emit light when the quantum dot display panel is in operation, and will not generate excitation light of quantum dots beyond the operation of the quantum dot display panel.

Accordingly, compared to the prior art, the lens array 210 of the present invention focuses the ambient light 700 onto the plurality of retaining walls 110, reducing excitation of the red quantum dots 121 and the green quantum dots 122 in the quantum dot display panel by the ambient light 700, and maintaining contrast of the quantum dot display panel.

Second Embodiment

Figure 9:
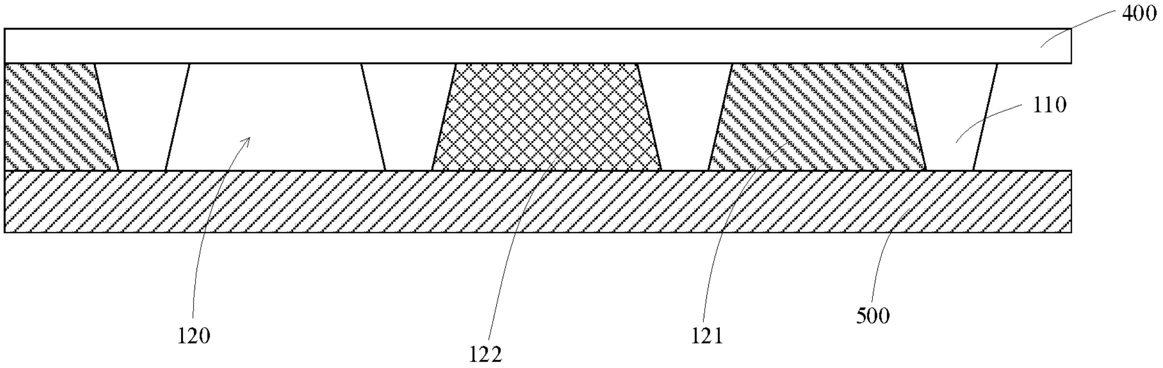
FIGS. 9 and 10 are structural diagrams of manufacturing processes of a quantum dot display panel according to a second embodiment of the present invention.
Figure 10:
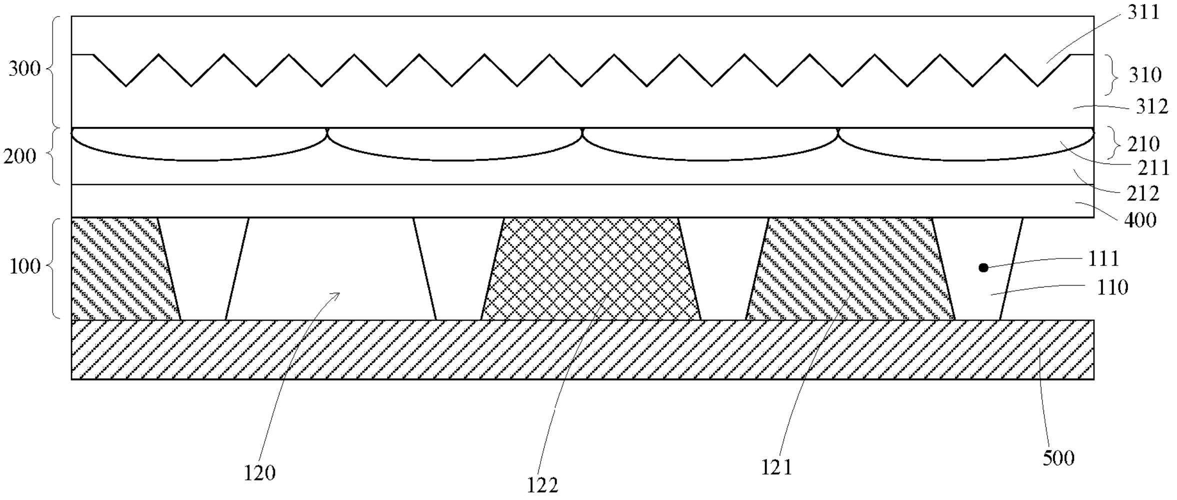

FIGS. 9 and 10 are structural diagrams of manufacturing processes of a quantum dot display panel according to a second embodiment of the present invention.

First, as shown in FIG. 9, a plurality of retaining walls 110 are formed on a substrate 400 by photolithography or an inkjet printing process. A plurality of sub-pixels 120 are defined between the plurality of retaining walls 110. Two out of every three of the plurality of sub-pixels 120 are filled with red quantum dots 121 and green quantum dots 122 by the photolithography or the inkjet printing process.

A blue backlight source 500 is attached onto a side of the plurality of pixels 120 opposite to the substrate 400. The blue backlight source 500 is a light source of a blue organic light-emitting diode (blue OLED) or a blue micro light-emitting diode (micro LED). Light of the blue backlight source 500 passes through each of the plurality of sub-pixels 120 from below the pixel layer 100 to above the pixel layer 100. The light of the blue backlight source 500 excites the red quantum dots 121 and the green quantum dots 122, so that the red quantum dots 121 emit red light, and the green quantum dots 122 emit green light. Therefore, every three of the plurality of sub-pixels 120 can display red, green, and blue light.

Next, as shown in FIG. 10, a lens array 200 is attached onto a side of the substrate 400 opposite to the plurality of sub-pixels 120. The lens layer 200 includes a lens array 210 consisting of a plurality of convex lenses 211 and a lens planarization layer 212 formed on the lens array 210. A surface of the lens array 200 opposite to the substrate 400 is a flat surface, and a surface of the lens planarization layer 212 opposite to the lens array 210 is a flat surface. A focus of each of the plurality of convex lenses 211 must be aligned with each of the plurality of retaining walls 110, and the focus 111 of each of the plurality of convex lenses 211 is located in anywhere of each of the plurality of retaining walls 110 corresponding to each of the plurality of convex lenses 211.

An enhancement film 300 is attached onto a side of the lens array 200 opposite to the substrate 400. The enhancement film 300 includes a prism array 310 consisting of a plurality of prisms 311 facing the lens array 210 and a prism planarization layer 312 disposed on the prism array 310 facing the lens array 210. A surface of the enhancement film 300 opposite to the lens array 210 is a flat surface, and a surface of the prism planarization layer 312 opposite to the prism array 310 is a flat surface.

In the second embodiment of the present invention, a laminated sequence of the quantum dot display panel is: the blue backlight source 500, the pixel layer 100 including the plurality of retaining walls 110 and the plurality of sub-pixels 120, the substrate 400, the lens layer 200 including the lens array 210 and the lens planarization layer 212, and the enhancement film 300 including the prism array 310 and the prism planarization layer 312.

Although the present invention has been disclosed above with the preferred embodiments, it is not intended to limit the present invention. Persons having ordinary skill in this technical field can still make various alterations and modifications without departing from the scope and spirit of this invention. Therefore, the scope of the present invention should be defined and protected by the following claims and their equivalents.

What is claimed is:

1. A quantum dot display panel, comprising:

a pixel layer comprising a plurality of retaining walls and a plurality of sub-pixels defined between the plurality of retaining walls;

a lens layer disposed on the pixel layer and comprising a lens array consisting of a plurality of convex lenses; and an enhancement film disposed on the lens layer and comprising a prism array consisting of a plurality of prisms facing the pixel layer;

wherein a focus of each of the plurality of convex lenses is located in each of the plurality of retaining walls corresponding to each of the plurality of convex lenses.

2. The quantum dot display panel as claimed in claim 1, wherein the quantum dot display panel further comprises a blue backlight source disposed under the pixel layer, and the blue backlight source is a light source of a blue organic light-emitting diode or a blue micro light-emitting diode.

3. The quantum dot display panel as claimed in claim 2, wherein light of the blue backlight source passes through each of the plurality of sub-pixels from below the pixel layer to above the pixel layer.

4. The quantum dot display panel as claimed in claim 3, wherein two out of every three of the plurality of sub-pixels are filled with red quantum dots and green quantum dots.

5. The quantum dot display panel as claimed in claim 4, wherein the plurality of retaining walls, the red quantum dots, and the green quantum dots are formed by photolithography or an inkjet printing process.

6. The quantum dot display panel as claimed in claim 1, wherein the lens layer is resin or an organic material, and the lens array is formed by imprinting.

7. The quantum dot display panel as claimed in claim 1, wherein a surface of the lens layer opposite to the pixel layer is a flat surface; and the lens layer further comprises a lens planarization layer covering a surface of the lens array facing the pixel layer and forming a flat surface.

8. The quantum dot display panel as claimed in claim 1, wherein a surface of the enhancement film opposite to the lens layer is a flat surface; and the enhancement film further comprises a prism planarization layer covering a surface of the prism array facing the lens layer and forming a flat surface.

9. The quantum dot display panel as claimed in claim 1, wherein the quantum dot display panel further comprises a substrate; and the pixel layer, the lens layer, the substrate, and the enhancement film are sequentially laminated from bottom to top.

10. The quantum dot display panel as claimed in claim 1, wherein the quantum dot display panel further comprises a substrate; and the pixel layer, the substrate, the lens layer, and the enhancement film are sequentially laminated from bottom to top.

11. A manufacturing method of a quantum dot display panel, comprising the steps of:

step S10: forming a pixel layer, wherein the pixel layer comprises a plurality of retaining walls and a plurality of sub-pixels defined between the plurality of retaining walls;

step S20: forming a lens layer on the pixel layer, wherein the lens layer comprises a lens array consisting of a plurality of convex lenses; and step S30: forming an enhancement film on the lens layer, wherein the enhancement film comprises a prism array consisting of a plurality of prisms facing the pixel layer;

wherein a focus of each of the plurality of convex lenses is located in each of the plurality of retaining walls corresponding to each of the plurality of convex lenses.

12. The manufacturing method of the quantum dot display panel as claimed in claim 11, wherein the step S20 further comprises the step of:

step S21: forming the lens layer on a substrate; and wherein the pixel layer, the lens layer, the substrate, and the enhancement film are sequentially laminated from bottom to top.

13. The manufacturing method of the quantum dot display panel as claimed in claim 11, wherein the step S20 further comprises the step of:

step S21: forming the lens layer on a substrate; and wherein the pixel layer, the substrate, the lens layer, and the enhancement film are sequentially laminated from bottom to top.

14. The manufacturing method of the quantum dot display panel as claimed in claim 11, further comprising the step of:

step S40: forming a blue backlight source under the pixel layer, wherein the blue backlight source is a light source of a blue organic light-emitting diode or a blue micro light-emitting diode.

15. The manufacturing method of the quantum dot display panel as claimed in claim 14, wherein light of the blue backlight source passes through each of the plurality of sub-pixels from below the pixel layer to above the pixel layer.

16. The manufacturing method of the quantum dot display panel as claimed in claim 15, wherein the step S10 further comprises the step of:

step S11: filling two out of every three of the plurality of sub-pixels with red quantum dots and green quantum dots.

17. The manufacturing method of the quantum dot display panel as claimed in claim 16, wherein the step S10 further comprises the step of:

step S12: forming the plurality of retaining walls, the red quantum dots, and the green quantum dots by photolithography or an inkjet printing process.

18. The manufacturing method of the quantum dot display panel as claimed in claim 11, wherein the step S20 further comprises the step of:

step S22: forming the lens array by imprinting, wherein the lens layer is resin or an organic material.

19. The manufacturing method of the quantum dot display panel as claimed in claim 11, wherein the step S20 further comprises the step of:

step S23: covering a lens planarization layer on a surface of the lens array facing the pixel layer and forming a flat surface; and wherein a surface of the lens layer opposite to the pixel layer is a flat surface.

20. The manufacturing method of the quantum dot display panel as claimed in claim 11, wherein the step S30 further comprises the step of:

step S31: covering a prism planarization layer on a surface of the prism array facing the lens layer and forming a flat surface; and wherein a surface of the enhancement film opposite to the lens layer is a flat surface.

* * * * *